US005750417A

United States Patent [19]

Nellissen

[11] Patent Number: 5,750,417
[45] Date of Patent: May 12, 1998

[54] METHOD OF MANUFACTURING A DEVICE HAVING A SUPPORT BAR WITH CONDUCTOR TRACKS FOR ELECTRICALLY CONTACTING A SEMICONDUCTOR ELEMENT

[75] Inventor: Antonius J. M. Nellissen, Eindhoven, Netherlands

[73] Assignee: U.S. Philips Corporation, New York, N.Y.

[21] Appl. No.: 423,247

[22] Filed: Apr. 13, 1995

[30] Foreign Application Priority Data

Apr. 15, 1994 [EP] European Pat. Off. .............. 94201027

[51] Int. Cl.$^6$ .......................... H01L 21/52; H01L 21/58; H01L 21/60
[52] U.S. Cl. ...................... 437/209; 250/492.22; 437/935
[58] Field of Search ................................ 437/209, 935; 250/492.22

[56] References Cited

U.S. PATENT DOCUMENTS

| | | | |
|---|---|---|---|
| 4,903,109 | 2/1990 | Kooi | 357/50 |
| 4,922,378 | 5/1990 | Malhi et al. | 361/387 |
| 5,057,444 | 10/1991 | Fuse et al. | 437/35 |
| 5,198,886 | 3/1993 | Verspeek et al. | 257/727 |
| 5,306,390 | 4/1994 | Peek | 437/35 |

FOREIGN PATENT DOCUMENTS 0439227  7/1991  European Pat. Off. ...... H01L 23/498

OTHER PUBLICATIONS

S. Wolf and R. Tauber, Silicon Processing for the VLSI Era, vol. 1: Process Technology, Lattice Press, pp. 436, 467, Jan. 1, 1986.

Primary Examiner—John Niebling
Assistant Examiner—Kevin Turner
Attorney, Agent, or Firm—Steven R. Biren

[57] ABSTRACT

A method of manufacturing a device which starts with a support bar with a first main surface provided with a groove suitable for accommodating a semiconductor element. The groove has walls on which conductor tracks are provided which continue over the first main surface. This method is particularly suitable for making support bars which serve as envelopes for semiconductor elements. The conductor tracks are provided through patterning of a conductive material by means of a patterned photoresist which is provided on the support bar and irradiated from two directions, at such an angle to the first main surface and to the groove that the bottom of the groove is not irradiated, whereas portions of the walls and of the first main surface are irradiated, after which the photoresist and an applied layer of conductive material are brought into a pattern. This method is more reliable than the known method. In the new method, the geometry of the support bar is used for irradiating the photoresist. An edge of the groove screens the bottom of the groove from irradiation. Irradiation from two directions insures that the photoresist on the first main surface and on both walls of the groove is irradiated.

20 Claims, 3 Drawing Sheets

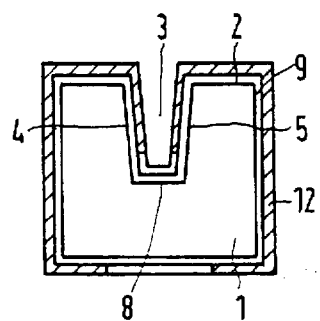
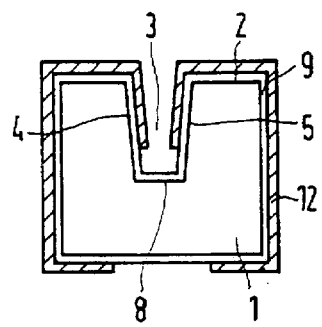
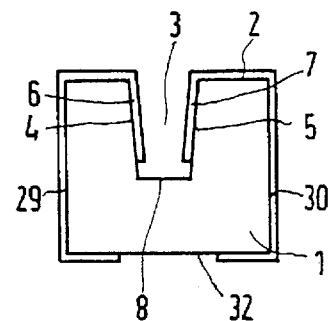
FIG.1a    FIG.1b    FIG.1c
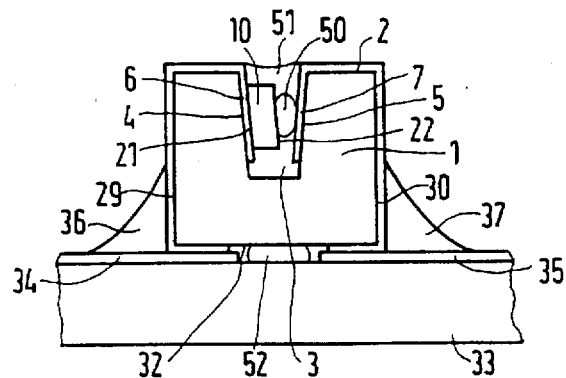
FIG.1d
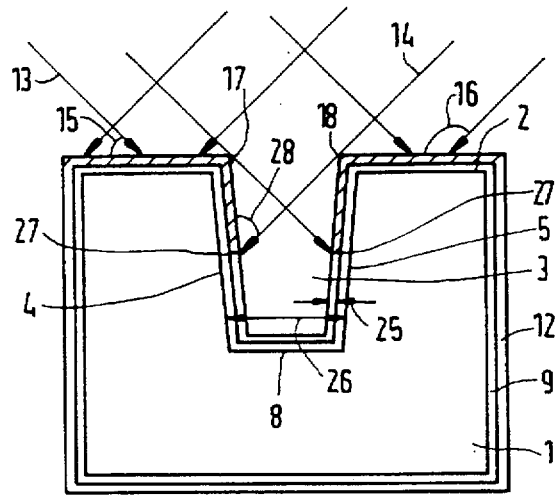
FIG.2

METHOD OF MANUFACTURING A DEVICE HAVING A SUPPORT BAR WITH CONDUCTOR TRACKS FOR ELECTRICALLY CONTACTING A SEMICONDUCTOR ELEMENT

BACKGROUND OF THE INVENTION

This invention relates to a method of manufacturing a device which is based on a support bar having a first main surface provided with a groove suitable for accommodating a semiconductor element, which groove comprises walls on which conductor tracks are provided which continue over the first main surface.

Such a method is very suitable for making support bars which serve as envelopes for semiconductor elements.

European Patent Application no. 439227 discloses a method of the kind mentioned in the opening paragraph whereby the conductor tracks are provided through, in that order, electroless nucleation of a support bar with a metal, removal of or rendering non-conductive the metal on a bottom of the groove through laser irradiation, whereby a conductive metal pattern is created, and electrochemical thickening of the conductive metal pattern.

The known method described has the disadvantage that short-circuits sometimes arise between the conductor tracks. A support bar with a short-circuit is of no use in enveloping a semiconductor element. It is found to be difficult to remove or render non-conductive the metal on the bottom of the groove.

SUMMARY OF THE INVENTION

The invention has for its object, inter alia, to counteract said disadvantage.

According to the invention, the method is for this purpose characterized in that the conductor tracks are provided through patterning of a conductive material by means of a patterned photoresist, which photoresist is provided on the support bar and is irradiated from two directions at such an angle to the first main surface and to the groove that a bottom of the groove is not irradiated and portions of the walls and of the first main surface are irradiated, after which the photoresist and a layer of conductive material provided are patterned. The term "photoresist" is here understood to mean a laquer which is sensitive to radiation such as, for example, electrons or light, while "to irradiate" means to expose the photoresist to the radiation.

The method according to the invention is more reliable than the known method. In the method according to the invention, the geometry of the support bar is utilized for irradiating the photoresist. An edge of the groove screens the bottom of the groove, so that it is not irradiated. The photoresist on the first main surface as well as on both groove walls is irradiated in that exposure takes place from two directions. The photoresist is used for making conductor tracks which extend over an edge of the groove and continue over a portion of the first main surface adjoining the groove, while the bottom of the groove is free from conductor tracks. The conductor tracks are present then on mutually opposed walls of the groove, being electrically separated because there are no conductor tracks on the groove bottom. The photoresist is patterned, for example, through development of the photoresist and an aftertreatment, for example, a treatment at a temperature higher than room temperature (baking). The patterned photoresist is subsequently used for obtaining a pattern of conductor tracks.

A support bar manufactured in accordance with the invention without short-circuits at the bottom of the groove is highly suitable for manufacturing semiconductor devices in an SMD (Surface Mounted Device) technology. Preferably, after the provision of the conductor tracks, a semiconductor element is provided in the groove, whereby the semiconductor element makes electrical contact with the conductor tracks on the walls, after which the support bar is subdivided into separate semiconductor devices, each comprising part of the support bar and one or several semiconductor elements. The groove is preferably filled up with an insulating material, such as epoxy resin, after the semiconductor elements have been provided. In practice, many semiconductor elements are provided in the groove, after which the support bar is split up into individual semiconductor devices.

In practice, the photoresist has a thickness which lies between 0.5 and 50 µm. Given groove widths which are of the same order of magnitude as the thickness of the photoresist, the groove will be practically completely filled with photoresist. Development of a non-irradiated portion on the bottom of the groove then gives rise to practical problems. In addition, reflections against walls and against the photoresist surface then occur in the photoresist, which adversely affect the accuracy with which a pattern is provided in the photoresist. Preferably, a photoresist is provided with a thickness which is small compared with a width of the groove. It is possible then to provide a well-defined pattern in the photoresist, while also the development of the photoresist on the bottom of the groove does not cause any problems.

The photoresist may be provided by various methods, for example, spraying, spinning, or immersion. Preferably, the photoresist is provided by electrophoresis and, after being provided but before irradiation, is baked at a temperature between 40° and 60° C. The photoresist is found to have a much more homogeneous thickness in the case of support bars provided with an electrophorectically provided photoresist, especially in a region around the groove. The photoresist becomes too soft at a baking temperature above 60° C., so that it flows out, which causes the groove to fill up. At a baking temperature below 40° C. the photoresist is also too soft, so that scratches in the photoresist may easily arise, for example, during handling of the support bar with photoresist. With the use of a baking temperature of between 40° and 60° C. the photoresist has such a consistency that flowing of the photoresist is prevented while at the same time the photoresist is sufficiently hard for withstanding the handling.

The accuracy with which a pattern can be made in the photoresist depends not only on the photoresist provided itself but also on the method of exposure. Preferably, the photoresist is exposed to a light beam which comprises substantially parallel light. A boundary between non-exposed and exposed photoresist is sharp then, so that an accurate pattern can be provided in the photoresist. Preferably, the collimation angle of the light beam is smaller than 2°. No problems with the accuracy of the pattern are found to arise in practice then.

Preferably, the light beam is polarized in a direction which is parallel to a plane of incidence, while the light beam encloses an angle of between 30° and 40° with the surface of the photoresist in the groove. The plane of incidence is parallel to a cross-section through the support bar perpendicular to the longitudinal direction of the bar. Under these conditions the reflection of the light beam on the surface of the photoresist is substantially nil. No irradiation of photoresist in the bottom of the groove takes place then owing to reflection, so that a sharper pattern is imaged in the photoresist.

In the known method, the conductor tracks continue over a side face of the support bar to a second main surface of the support bar situated opposite the first main surface. According to the invention, the conductor tracks are provided through direct irradiation of the photoresist on the one main surface, while the photoresist on the other main surface is irradiated indirectly via a reflecting surface, the side face screening off a portion of the other main surface and the photoresist on the side face being irradiated directly and/or indirectly.

Conductor tracks extending from a first to a second main surface of the support bar are thus provided in the method according to the invention by means of a single exposure step.

Preferably, several support bars are irradiated in one and the same process step, which support bars are so positioned that their grooves lie mutually parallel and the distance between the support bars is such that a support bar screens off a side face of an adjoining support bar against indirect irradiation. The side face is then irradiated directly only, any indirect irradiation being prevented by an adjoining support bar.

In the method according to the invention as discussed above, a conductor track is provided which is not structured in a longitudinal direction of the support bar. The conductor tracks must be further patterned on the wall if a semiconductor device having several separate conductor tracks on one wall of the groove is to be manufactured. Preferably, the method according to the invention is characterized in that a mask is used through which light is incident on a directly irradiated surface, while light is incident on an indirectly irradiated surface via the mask and the reflecting surface. The mask is used for giving the photoresist a further pattern. The method according to the invention requires only one mask which is used for patterning the photoresist on the wall, on the first main surface, on the side face, and on the second main surface. The photoresist may be provided with a further pattern in a simple manner by the method according to the invention.

Preferably, the mask comprises a pattern which extends mainly in one direction, the direction of the pattern on the mask being substantially transverse to a longitudinal direction of the groove. It is possible then, for example, to make many parallel conductor tracks which extend over a wall of the groove, over the first main surface, a side face, and the second main surface.

Although, as stated above, the conductor tracks could be provided by selective deposition or by a lift-off technique, the conductor tracks are preferably provided through the application of a metal layer on the support bar, the application of a negative photoresist, exposure of the photoresist, removal of the non-exposed portion of the photoresist, and etching of the metal layer. The conductor tracks may thus be provided in a simple and reliable manner.

BRIEF DESCRIPTION OF THE DRAWING

The invention will be explained in more detail below by way of example with reference to the drawing, in which:

FIG. 1 shows a few stages in the manufacture of a semiconductor device by the method according to the invention;

FIG. 2 is a cross-section of a support bar on which a pattern is provided on a first main surface and in the groove by the method according to the invention;

DESCRIPTION OF THE PREFERRED EMBODIMENTS

Figure 3:
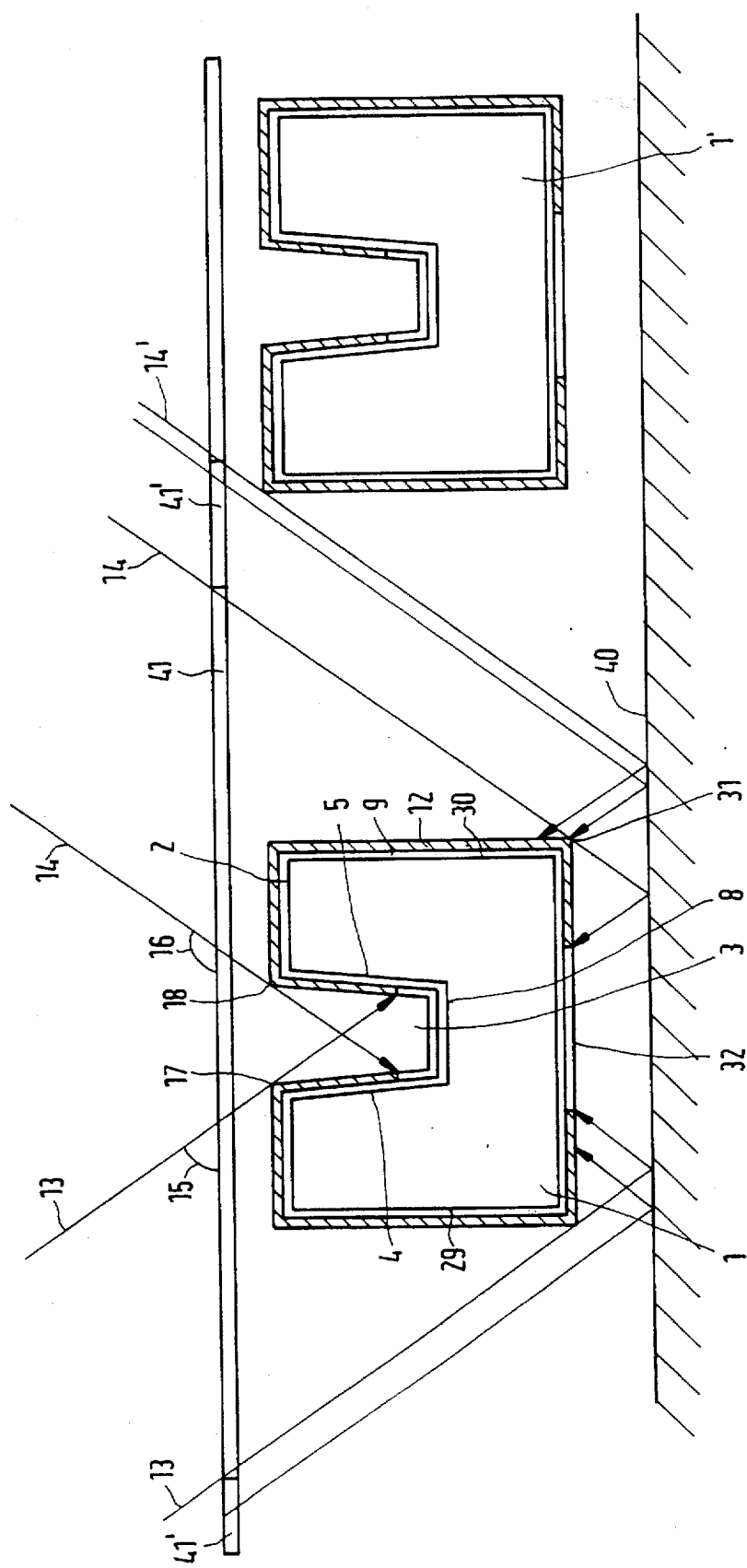
FIG. 3 is a cross-section of a support bar on which a pattern is provided on a first main surface, in the groove, on side faces, and on a second main surface by the method according to the invention.

FIG. 1 is a lateral view of a method of manufacturing a semiconductor device which starts with a support bar 1 with a first main surface 2 provided with a groove 3 having walls 4, 5 on which conductor tracks 6, 7 are provided, continuing over the first main surface 2, after which a semiconductor element 10 is provided in the groove 3 with a clamping fit, the semiconductor element 10 making electrical contact with the conductor tracks 6, 7 on the respective walls 4, 5. In practice, the support bar 1 is usually elongate with the groove 3 running in the longitudinal direction of the support bar 1, i.e. the longitudinal direction is transverse to the plane of drawing in FIGS. 1 to 3.

Such a method is suitable for manufacturing semiconductor devices which are mounted in an SMD (Surface Mounted Device) envelope.

The manufacture of such a semiconductor device is known, the conductor tracks 6, 7 being provided through, in that order, electroless nucleation of a support bar 1 with a metal, removal or rendering non-conductive of the metal on the bottom 8 of the groove 3 through irradiation with a laser, whereby a conductive pattern is created in the metal, and electrochemical thickening of the conductive pattern of the metal.

The known method described has the disadvantage that short-circuits sometimes arise between the conductor tracks 6, 7. Removal or rendering non-conductive of the metal on the bottom 8 of the groove 3 is found to be difficult.

FIGS. 1 and 2 show the method according to the invention which is characterized in that the conductor tracks 6, 7 are provided through patterning of a conductive material 9 by means of a patterned photoresist 12, which photoresist 12 is provided on the support bar 1 and is irradiated from two directions 13, 14 at such an angle 15, 16 to the first main surface 2 and to the groove 3 that a bottom 8 of the groove 3 is not irridiated whereas portions of the walls 4, 5 and the first main surface 2 are irradiated (see FIG. 2, where the hatched portion of the photoresist 12 is irradiated), after which the photoresist 12 and a layer of conductive material 9 provided are patterned (see FIG. 1).

The method according to the invention is more reliable than the known method. In the method according to the invention, the geometry of the support bar 1 is utilized in the exposure of the photoresist 12. Edges 17, 18 of the groove 3 cut off the bottom 8 of the groove 3, so that it is not irradiated. Irradiation from two directions 13, 14 leads to an exposure of the photoresist 12 on the first main surface 2 and on the two walls 4, 5 of the groove 3.

The photoresist 12 is used for making conductor tracks 6, 7 which extend over walls 4, 5 of the groove 3 and continue over portions of the first main surface 2 adjoining the groove 3, while the bottom 8 of the groove 3 is free from conductor tracks 6, 7. The conductor tracks 6, 7 then lie on mutually opposed walls 4, 5 of the groove 3, which walls are electrically separated because there are no conductor tracks 6, 7 on the bottom 8 of the groove 3. FIG. 1d shows how a semiconductor element 10 provided in the groove 3 makes electrical contact, for example, by its lower side 21, with the conductor track 6 on the one wall 4, while an upper side 22 of the semiconductor element 10 is in contact with the conductor track 7 on the other wall by a raised contact bump 50.

The photoresist is patterned, for example, through development of the photoresist and an aftertreatment, for example a treatment at a temperature higher than room temperature (baking).

The patterned photoresist 12 may be used in various ways for obtaining a pattern of conductor tracks 6, 7. When a positive photoresist 12 is used, the photoresist 12 remains on the bottom 8 of the groove 3 after development and aftertreatment, while no photoresist 12 is present on the walls 4, 5 of the groove 3. A conductive material is then selectively deposited on these walls 4, 5. This may be done, for example, by electroless deposition of a nucleating layer of copper on the entire support bar, application and patterning of a positive photoresist, copperplating of the nucleating layer not covered by photoresist, removal of the photoresist through dissolving of the photoresist, and etching of the copper for a short period so that the nucleating layer is etched away but the electroplated copper layer retains a sufficient thickness. FIG. 1 shows how a negative photoresist 12 is used. The support bar 1 is then first provided with a layer of conductive material 9 which is covered with the negative photoresist 12 (see FIG. 1a). After exposure, development, and aftertreatment of the negative photoresist 12, the latter remains on walls 4, 5 of the groove 3, but has been taken off the bottom 8 of the groove 3 (see FIG. 1b). The layer of conductive material 9 is then removed from the bottom 8, for example, by means of etching (see FIG. 1c). Alternatively, the patterned photoresist 12 may be used for providing a conductor track pattern 6, 7 by means of a technique which is known per se, such as lifting off.

In practice, the photoresist has a thickness 25 which lies between 0.5 and 50 μm (see FIG. 2). With widths 26 of the groove 3 which are of the same order of magnitude as the thickness 25 of the photoresist 12, the groove 3 will be practically entirely filled with photoresist 12. The development of a non-irradiated portion on the bottom 8 of the groove 3 then leads to practical problems because of the irradiated photoresist 12 present high in the groove 3. In addition, reflections with walls 4, 5 and with the surface of the photoresist 12 then take place in the photoresist 12, adversely affecting the accuracy with which a pattern is provided in the photoresist 12. Preferably, a photoresist 12 is provided to a thickness 25 which is small compared with a width 26 of the groove 3. It is possible then to provide a well-defined pattern in the photoresist 12, while also the development of the photoresist 12 on the bottom 8 of the groove 3 does not give rise to problems.

The photoresist 12 may be applied in various manners, for example, by spraying, spinning, or immersion. Preferably, the photoresist 12 is provided by electrophoresis. As an example, the negative photoresist ED2100 from Shipley, or the positive photoresist Optimet P2000 from Ciba Geigy may be used. The photoresist is then provided in an electrochemical process in known manner in accordance with the manufacturer's instructions. The experience is that the photoresist 12 on support bars 1 provided with an electrophoretically provided photoresist 12 has a much more homogeneous thickness 25, especially in an area around the groove 3.

Preferably, the photoresist 12 is baked out at a temperature of between 40° and 60° C. after being applied and before exposure. At a baking temperature above 60° C. the photoresist 12 becomes too soft, so that it flows out, which would lead, for example, to the groove 3 filing up. At a baking temperature below 40° C. the photoresist 12 is also too soft, so that scratches may easily arise in the photoresist 12, for example during handling of the support bar 1 with photoresist 12. With a baking temperature between 40° and 60° the photoresist 12 has a consistency such that flowing out of the photoresist 12 is prevented, while the photoresist 12 is also hard enough for withstanding the handling.

The accuracy with which a pattern can be made in the photoresist 12 depends not only on the photoresist 12 provided but also on the manner of exposure. Preferably, the photoresist 12 is irradiated with a light beam which comprises substantially parallel light. A boundary 27 between non-irradiated and irradiated photoresist 12 is sharp then, so that an accurate pattern can be provided in the photoresist 12 (see FIG. 2). Preferably, a collimation angle of the light beam is smaller than 2°. In practice, no problems are found to arise then concerning the accuracy of the pattern in the photoresist 12.

Preferably, the light beam is polarized in a direction which is parallel to a plane of incidence, in this case parallel to the plane of drawing of FIG. 2, while the light beam encloses an angle 28 of between 30° and 40° with the photoresist surface in the groove. The reflection of the light beam on the surface of the photoresist is substantially nil under these conditions. No irradiation of photoresist in the bottom of the groove takes place then owing to reflection, so that a sharper pattern is imaged in the photoresist.

FIGS. 1c and 1d show how the conductor tracks 6, 7 continue over a side face 29, 30 of the support bar 1 to a second main surface 32 of the support bar 1 situated opposite the first main surface 2. FIG. 1d shows how the semiconductor device is given a final mounting as a so-called "Surface Mounted Device" (SMD). In this example, the conductor tracks 6, 7 on the second main surface 32 form contact pads with which the semiconductor device is mounted on a printed circuit board 33. The conductor tracks 34, 35 on the printed circuit board 33 make contact then with the conductor tracks 6, 7 on the support bar 1 via soldered joints 36, 37. FIG. 3 shows how, according to the invention, the conductor tracks 6, 7 are provided through direct irradiation of the photoresist 12 on the one main surface 2, whereas the photoresist on the other main surface 32 is irradiated indirectly via a reflecting surface 40, the side faces 29, 30 cutting off a portion of the other main surface 32, while the photoresist 12 on the side faces 29, 30 is irradiated directly as well as indirectly. In the situation shown in FIG. 3, the hatched portion of the photoresist 12 is irradiated. The side faces 29, 30 are also partly irradiated indirectly by way of the mirror 40. This provides an additional advantage in that a corner point 31 of the support 1, which normally would be difficult to irradiate, is well exposed (see FIG. 3). FIG. 3 shows how, when several support bars next to one another are irradiated simultaneously, a support bar 1' situated next to support bar 1 ensures that the entire side face 30 is not irradiated twice, i.e. directly and indirectly (light ray 14' indicating the boundary).

In the method according to the invention shown in FIGS. 3 and 1, conductor tracks 6, 7 are provided which extend over a wall 4, 5 of the groove 3, a portion of the first main surface 2, the side faces 29, 30 of the support bar 1, and over a portion of the second main surface 32 of the support bar 1, in one exposure step. Since each side face 29, 30 screens off a portion of the second main surface 32, the photoresist 12 can be so patterned on the second main surface 32 that conductor tracks 6 of the one wall 4 do not make electrical contact with conductor tracks 7 on the other wall 5 of the groove 3.

In the method according to the invention as discussed above, a conductor rack 6, 7 is provided on each wall 4, 5 of the groove such that it extends over the first main surface 2, a side face 29, 30, and the second main surface 32 of the support bar 1. Since the bottom 8 of the groove 3 is not covered with a conductive material 9, and since a portion of the second main surface 32 is cut off by the relevant side face 29, 30, a conductor track 6 on the one wall 4 is not in contact with a conductor track 7 on the other wall 5. Such a method is highly suitable for the manufacture of semiconductor devices with two gates, such as diodes, the two gates of the semiconductor device being connected to the different conductor tracks 6, 7 on the walls 4, 5 of the groove 3. If a semiconductor device having more than two gates is to be manufactured, the conductor tracks 6, 7 on the walls 4, 5 must be given further patterns. FIG. 3 shows that the method according to the invention is preferably characterized in that a mask 41 is used through which light is incident on a directly exposed surface 2, 29, 30, whereas light is incident through the mask 41 and via the reflecting surface 40 on an indirectly exposed surface 32, 29, 30. The mask 41 is used for giving the photoresist 12 a further pattern. In the method according to the invention, only one mask is necessary which is used for providing further patterns on the walls 4, 5, on the first main surface 2, on the side faces 29, 30, and on the second main surface 32. The portion of the mask 41 used for direct irradiation is present above the one main surface 2, while the mask 41 extends laterally of the support bar 1. The portion 41' of the mask laterally of the support bar 1 is used for irradiating the second main surface 32 via the reflecting surface 40. It is achieved thereby that the photoresist 12 can be provided with a further pattern in a simple manner.

Figure 4:
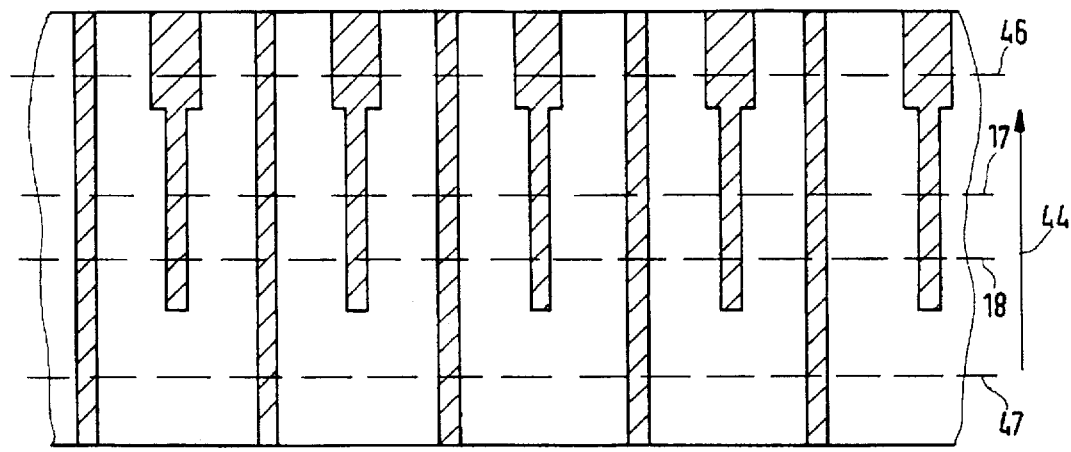
FIG. 4 is a plan view of a mask used in the method according to the invention.
Figure 5:
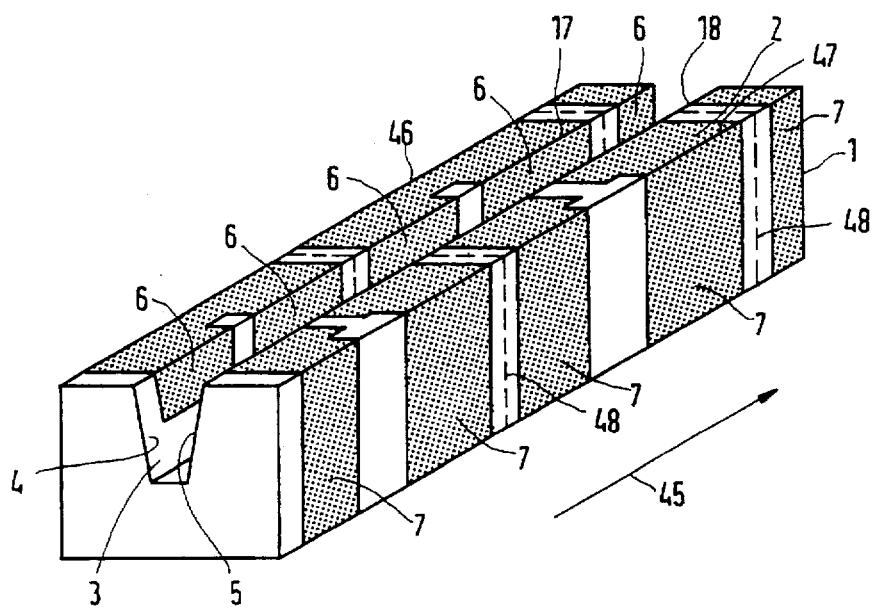
FIG. 5 shows a support bar provided with many parallel conductor tracks. The Figures are purely diagrammatic and not drawn to scale. Corresponding components have generally been given the same reference numerals in the Figures.

FIG. 4 is a plan view of a pattern on mask 41. Preferably, the mask 41 comprises a pattern which extends mainly in one direction 44, which direction 44 of the pattern on the mask 41 is substantially perpendicular to a longitudinal direction 45 (see FIG. 5) of the groove 3. The mask 41 of FIG. 4 shows the positions of the edges 17, 18 of the groove 3 by means of broken lines 17, 18, and the edges 46, 47 of the support bar 1 by means of broken lines 46, 47 (see FIG. 5). It is possible then, for example, to make many parallel conductor tracks 6, 7 which extend over a wall 4, 5 of the groove 3, over the first main surface 2, a side face 29, 30, and the second main surface 32. FIG. 5 shows a support bar 1 provided with such parallel conductor tracks 6, 7 made by means of the mask 41 of FIG. 4. After semiconductor bodies 10 have been provided, the support bar 1 of FIG. 5 is subdivided into individual semiconductor devices through splitting-up of the support bar, for example, by sawing in locations 48 indicated with broken lines. Two conductor tracks 7 will then be present on the wall 5 of the groove and one conductor track 6 on the wall 4 of each semiconductor element, so that the semiconductor element 10 may be, for example, a transistor. A semiconductor element 10 having several gates may be provided in the groove 3 in that the conductor tracks 6, 7 are split up into several tracks, which gates can be extended to contact pads on the second main surface 32 via the parallel conductor tracks 6, 7. Contact may then be made with the gates of the semiconductor element 10 via the parallel conductor tracks 6, 7 in the case of mounting on a printed circuit board 33.

Although the conductor tracks 6, 7 may be provided by selective deposition or a lift-off technique, as stated above, the conductor tracks 6, 7 are preferably provided by the method shown in FIG. 1 in that a metal layer 9 is provided on the support bar 1, a negative photoresist 12 is provided, the photoresist 12 is exposed in accordance with FIG. 3, the non-exposed portion of the photoresist 12 is removed, and the metal layer 9 is etched. The conductor tracks 6, 7 may thus be provided in a simple and reliable manner.

An embodiment of the method according to the invention will now be discussed. A support bar 1 of ceramic material with a width of 2 mm, a height of 1.4 mm, a length of 30 µm, a groove depth of 800 cm, and a width 25 of the groove of 300 µm is used. First a copper layer 9 of 1.5 µm thickness is electrolessly provided on this support bar in known manner (FIG. 1a). An ED2100 Shipley photoresist 12 is provided on this copper layer 9 by electrophoresis to a layer thickness of approximately 10 µm. This photoresist is baked out at 60° C. for 10 minutes, after which the photoresist 12 is exposed with a mask 41 and mirror 40 in accordance with the invention (see FIGS. 3, 4). During exposure, the collimation angle of the light beam is 1.7°, and the angles 15 and 16 are 35° and 145°, respectively. After exposure, the photoresist 12 is developed in the manner prescribed for the photoresist 12. After development, the photoresist 12 is baked out once more at 80° C. for 15 minutes. The situation of FIG. 1b then results. The copper layer 9 is subsequently etched with a standard copper etchant. The photoresist is then removed by means of a resist remover belonging to the photoresist, in this case Shipley "2010 remover". The situation of FIG. 1c or FIG. 5 then arises. Semiconductor elements 10 are then inserted into the support bar 1, with clamping fit in the groove 3 (see FIG. 1d). The semiconductor elements 10 have a metallization at their lower side 21 which makes electrical contact with conductor tracks 6 on wall 4 of the groove. The upper side 22 of the semiconductor element is provided, for example, with several contact protrusions 50. Upon insertion into the groove 3, the protrusions 50 make electrical contact with several conductor tracks 7 situated next to one another. Thus several electrodes (inputs, outputs) of the semiconductor element 10 are connected to conductor tracks 6, 7 which extend to contact pads on the second main surface 32. The groove is subsequently filled up with a passivating agent 51 (see FIG. 1d), in this example an epoxy resin. The support bar is subsequently split up along lines 48 shown in FIG. 5. Individual semiconductor elements are created thereby. FIG. 5 only shows a small portion of the support bar 1 in which two semiconductor elements can be mounted. In practice, many semiconductor devices are manufactured from one support bar 1. FIG. 1d shows how the semiconductor device is glued with glue 52 onto a printed circuit board 33 provided with conductor tracks 34, 35. Soldered joints 36, 37 between the conductor tracks 6, 7 and the tracks 34, 35 on the printed circuit board 33 are then made.

Although certain techniques were used in the above examples, these are by no means meant to be limitations. Thus the patterned photoresist need not be removed in all cases. It is also possible to use instead of a metal layer 9 a layer of a different conductive material such as, for example, polycrystalline silicon or a conductive oxide. The photoresist 12 may be used for etching of the conductive layer 9, but also in techniques such as selective deposition of a conductive material, or lifting-off. It is possible in the method according to the invention, for example, to provide a first main surface 2, a side face 29, 30, and a portion of a second main surface 32 with a patterned photoresist 12 in a first step via the mask 41 and the mirror 40. A second mask may then be used for providing a further portion of the second main surface 32 with a patterned photoresist 12. This last method is advantageous especially for support bars 1 with a comparatively large first and second main surface 2, 32 and comparatively small side faces 29, 30. A second mask for further shaping a photoresist on a second main surface 32 is also useful when certain interconnections between the conductor tracks are to be provided in order to grow a patterned metal layer 9 further, for example by electroplating. The interconnections may then, for example, be localized at area 48 (FIG. 5), so that the interconnections are broken again when the support bar 1 is subdivided into individual semiconductor devices. The second mask may also act as a mirror locally. The contact pads in the example shown here lie on the second main surface 32 (see FIG. 1d). It is quite possible for the conductor tracks to continue only over the first main surface 2. In that case the semiconductor device is mounted with its main surface 2 on a printed circuit board. The invention is not limited to a support bar with a continuous groove as shown in the examples. The invention is also applicable, for example, when the groove is provided only locally, or when the groove has interruptions.

In practice, many support bars 1 are processed simultaneously in the method according to the invention. There is one large mask 41 then by means of which many support bars 1 are irradiated simultaneously, as illustrated in FIG. 3.

I claim:

1. A method of manufacturing a device which is based on a support bar having a first main surface provided with a groove suitable for accommodating at least one semiconductor element, which groove comprises walls on which conductor tracks are provided which continue over the first main surface, wherein the conductor tracks are provided through patterning of a conductive material by means of a patterned photoresist, which photoresist is provided on the support bar and is illuminated from two directions at such an angle to the first main surface and to the groove that a bottom of the groove is not and portions of the walls and of the first main surface are illuminated, after which the photoresist and a layer of conductive material provided are patterned.

2. A method as claimed in claim 1, which comprises inserting a semiconductor element into the groove after the patterning of the photoresist and the layer of conductive material so that the semiconductor element makes electrical contact with the conductor tracks on the walls of the groove, after which the support bar is subdivided into individual semiconductor devices which each comprise part of the support bar and at least one semiconductor element.

3. A method as claimed in claim 1, that a photoresist is provided to a thickness which is smaller than a width of the groove.

4. A method as claimed in claim 1, wherein the photoresist is provided by electrophoresis and, after being provided but before illumination is baked at a temperature between 40° and 60° C.

5. A method as claimed in 1, wherein the photoresist is exposed to a light beam which comprises substantially parallel light.

6. A method as claimed in claim 5, a collimation angle of the light beam is smaller than 2°.

7. A method as claimed in claim 5, wherein the light beam is polarized in a direction which is parallel to a plane of incidence, and the light beam encloses an angle of between 30° and 40° with a the surface of the photoresist in the groove.

8. A method as claimed in claim 1, wherein the conductor tracks continue over a side face of the support bar to a second main surface of the support bar situated opposite the first main surface, wherein the conductor tracks are provided through direct illumination of the photoresist on the one main surface, while the photoresist on the second main surface is illuminated indirectly via a reflecting surface, the side face screening off a portion of the second main surface, and the photoresist on the side face being illuminated.

9. A method as claimed in claim 8, which comprises illuminating several support bars in one and the same process step, which support bars are so positioned that their grooves are mutually parallel and the distance between the support bars is such that a support bar screens off a side face of an adjoining support bar against indirect illumination.

10. A method as claimed in claim 8, which comprises using a mask through which light is incident on a directly illuminated surface, and light is incident on an indirectly illuminated surface via the mask and the reflecting surface.

11. A method as claimed in claim 10, wherein the mask comprises a pattern which extends mainly in one direction, the direction of the pattern on the mask being substantially transverse to a longitudinal direction of the groove.

12. A method as claimed in claim 1, wherein the photoresist is a negative photoresist and the conductor tracks are provided by applying a metal layer on the support bar, applying the negative photoresist, exposing the negative photoresist, removing a non-exposed portion of the negative photoresist, and etching of the metal layer.

13. A method as claimed in claim 2, wherein the thickness of the photoresist is less than the width of the groove, and further comprising the step of baking the photoresist at a temperature between 40° C. and 60° C. before illumination thereof.

14. A method as claimed in claim 2, wherein the photoresist is illuminated by a parallel light beam polarized in a direction parallel to a plane of incidence, and wherein the light beam encloses an angle of between 30° and 40° with a surface of the photoresist in the groove.

15. A method of providing a support bar having a groove in a first main surface with conductor tracks on the walls of the groove and on the first main surface thereof, the method comprising:

applying a metal layer to the support bar so as to cover at least the walls of the groove and the first main surface of the support bar, applying a layer of photoresist over the metal layer, patterning the conductive material to provide the conductor tracks by illuminating the photoresist from two directions at an angle to the first main surface and the groove such that the bottom of the groove is not illuminated whereas portions of the groove walls and the first main surface are illuminated, and removing any non-illuminated portion of the photoresist and any metal layer at the bottom of the groove.

16. The method as claimed in claim 15, wherein the metal layer and the photoresist initially cover a side face and a part of a second main surface of the support bar opposite the first main surface, arranging the support bar in the vicinity of a light reflecting surface, and wherein the conductor tracks are provided by directly illuminating the photoresist on the one main surface, the side face of the support bar screens off a portion of the second main surface so that the photoresist on the second main surface is illuminated indirectly via the reflecting surface, and the photoresist on the side face is illuminated directly.

17. The method as claimed in claim 16, which further comprises:

positioning a plurality of support bars relative to one another and to the reflecting surface so that their respective grooves are mutually parallel and the distance between the support bars is chosen such that a support bar screens off a side face of an adjoining support bar against indirect illumination, the plurality of support bars being illuminated simultaneously in a same process step.

18. The method as claimed in claim 15, wherein the photoresist is applied by electrophoresis and thereafter, but before illumination thereof, baking the photoresist at a temperature between 40° C. and 60° C.

19. The method as claimed in claim 8, wherein the photoresist on the side face is directly illuminated by a parallel light beam.

20. The method as claimed in claim 15, wherein the photoresist is illuminated by two parallel light beams each of which forms an acute angle with a respective wall of the grove.

* * * * *